(12) United States Patent
Lee

(10) Patent No.: US 7,948,322 B2
(45) Date of Patent: May 24, 2011

(54) BALUN AMPLIFIER

(75) Inventor: Ching-Feng Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/624,417

(22) Filed: Nov. 24, 2009

(65) Prior Publication Data

US 2011/0063032 A1 Mar. 17, 2011

(30) Foreign Application Priority Data

Sep. 16, 2009 (TW) .............................. 98131236 A

(51) Int. Cl.
*H03F 3/04* (2006.01)
(52) U.S. Cl. ..................................... 330/301; 330/117
(58) Field of Classification Search .................. 330/301, 330/117, 311
See application file for complete search history.

(56) References Cited

U.S. PATENT DOCUMENTS 7,671,686 B2 * 3/2010 Kuo et al. .................. 330/301
7,834,703 B2 * 11/2010 Ganeshan ................... 330/301

OTHER PUBLICATIONS

Ming-Ching Kuo et al., "A 1.2 V 114 mW Dual-Band Direct-Conversion DVB-H Tuner in 0.13 μm CMOS," IEEE Journal of Solid-State Circuits, vol. 44, No. 3, Mar. 2009, pp. 740-750.

* cited by examiner

Primary Examiner — Henry K Choe
(74) Attorney, Agent, or Firm — Jianq Chyun IP Office

(57) ABSTRACT

A balun amplifier is provided, which includes two input terminals, two output terminals and two modules. The first and the second input terminals receive a single-ended input signal, respectively. The first and the second output terminals provide a differential output signal. The first module is coupled to the first input terminal, the first output terminal, and the second output terminal. The second module is coupled to the second input terminal, the first output terminal, and the second output terminal. The first and the second modules receive the single-ended input signal through the first and the second input terminals respectively, amplify the single-ended input signal respectively, and convert the single-ended input signal into the differential output signal. The circuit topologies of the first and the second modules are symmetric except that types of transistors in the first and the second modules are different.

22 Claims, 3 Drawing Sheets

BALUN AMPLIFIER

CROSS-REFERENCE TO RELATED APPLICATION

This application claims the priority benefit of Taiwan application serial no. 98131236, filed on Sep. 16, 2009. The entirety of the above-mentioned patent application is hereby incorporated by reference herein and made a part of specification.

BACKGROUND OF THE INVENTION

1. Field of the Invention

The present invention relates to a single-ended input, differential output amplifier (which is also referred to as a balun amplifier).

2. Description of Related Art

In a communication system that utilizes integrated circuits for amplifying the RF input signal, a single-ended input, differential output amplifier (a balun amplifier) is generally located at the most front end of the system for receiving the single-ended input signal from the antenna and converting the single-ended input signal to a differential signal for the following circuit stages that employ differential topology to facilitate the rejection of common mode disturbances in the noisy integrated circuit environment. Since the balun amplifier is located at the most front-end of the radio frequency system, the noise of the balun amplifier itself should be reduced to the minimum.

FIG. 1 is a circuit diagram illustrating a conventional balun amplifier 100. Wherein, the voltage source $V_S$ represents a single-ended input signal, and the resistors $R_{L1}$ and $R_{L2}$ represent the load impedances. The balun amplifier 100 receives the single-ended input signal $V_S$, amplifies the single-ended input signal $V_S$ through the common gate amplifier formed by a n-channel metal oxide semiconductor field effect transistor (which is referred to as an NMOS transistor hereinafter) $M_1$ and the common source amplifier formed by an NMOS transistor $M_2$, and further converts the single-ended input signal $V_S$ into a differential output signal for outputting it through output terminals A and B.

The channel noises generated in the NMOS transistors $M_1$ and $M_2$ would also cause noise currents in the balun amplifier 100. The noise currents pass through the resistors $R_{L1}$ and $R_{L2}$ and generate the noise voltage of the differential output signal between the output terminals A and B. The design of the balun amplifier 100 can cancel a part of the output noise caused by the channel noises of NMOS transistors $M_1$ and $M_2$.

Regarding the channel noise of the NMOS transistor $M_1$ in the balun amplifier 100, the load currents through the resistors $R_{L1}$ and $R_{L2}$ can be the same due to matches among $R_S$, $1/g_{m1}$ and $1/g_{m2}$, wherein $R_S$ is the impedance of the antenna, and $g_{m1}$ and $g_{m2}$ are respectively the transconductances of the NMOS transistors $M_1$ and $M_2$. In case that the resistors $R_{L1}$ and $R_{L2}$ are the same, the noise voltage between the output terminals A and B can be counteracted in the differential output signal, and the effect of the channel noise generated by the NMOS transistors $M_1$ is nullified.

Regarding the channel noise of the NMOS transistor $M_2$, the cross-coupling of NMOS transistors $M_3$ and $M_4$ increases the impedance Rc looking into the source of NMOS transistor $M_4$, so that an appreciable part of the noise current of the transistor $M_2$ would flow to the ground terminal through the output impedance of the transistor $M_2$. This accordingly reduces the noise current passing through the resistor $R_{L2}$, i.e., the effect of the channel noise generated by the transistor $M_2$ is also suppressed.

SUMMARY OF THE INVENTION

The present invention is directed to a balun amplifier, which can eliminate most of the output noise generated by the internal transistors.

The present invention provides a balun amplifier including a first input terminal, a second input terminal, a first output terminal, a second output terminal, a first module, and a second module. The first input terminal and the second input terminal respectively receive a single-ended input signal, and the first output terminal and the second output terminal respectively provide a differential output signal. The first module is coupled to the first input terminal, the first output terminal, and the second output terminal. The second module is coupled to the second input terminal, the first output terminal, and the second output terminal. The first module and the second module respectively receive the single-ended input signal through the first input terminal and the second input terminal, respectively amplify the single-ended input signal, and convert the single-ended input signal into the differential output signal. Circuit structures of the first module and the second module are symmetric to each other except that types of the transistors in the first module and the second module are different.

The present invention provides another balun amplifier including a first input terminal, a second input terminal, a first output terminal, a second output terminal, a first transistor, a second transistor, a third transistor and a fourth transistor. The first input terminal and the second input terminal respectively receive a single-ended input signal, and the first output terminal and the second output terminal respectively provide a differential output signal. The first transistor is coupled between the first input terminal and the first output terminal for receiving the single-ended input terminal from the first input terminal, and outputting the amplified single-ended input signal through the first output terminal. The second transistor is coupled between the first input terminal and the second output terminal for receiving the single-ended input terminal from the first input terminal, and outputting the amplified single-ended input signal through the second output terminal. The third transistor is coupled between the second input terminal and the first output terminal for receiving the single-ended input terminal from the second input terminal, and outputting the amplified single-ended input signal through the first output terminal. The fourth transistor is coupled between the second input terminal and the second output terminal for receiving the single-ended input terminal from the second input terminal, and outputting the amplified single-ended input signal through the second output terminal.

According to the skillful design of the coupling relations between the four transistors and other devices, the balun amplifier have features of both converting a single-ended signal to a differential signal with simple circuit structure and exhibiting quite low output noise.

In order to make the aforementioned and other features of the present invention more comprehensible, several exemplary embodiments accompanied with figures are described in detail below.

BRIEF DESCRIPTION OF THE DRAWINGS

The accompanying drawings are included to provide a further understanding of the invention, and are incorporated

DESCRIPTION OF THE EMBODIMENTS

Figure 1:
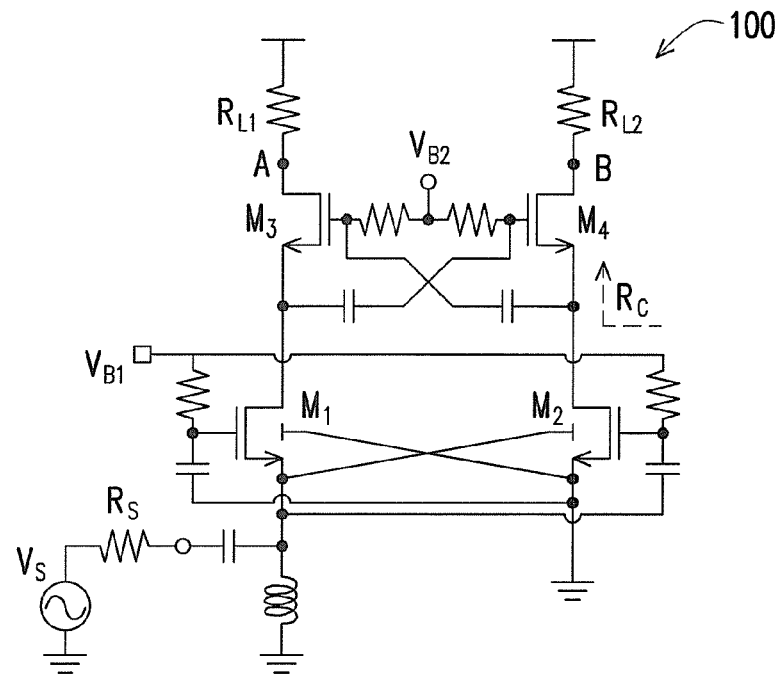
FIG. 1 is a circuit diagram illustrating a conventional balun amplifier.
Figure 2:
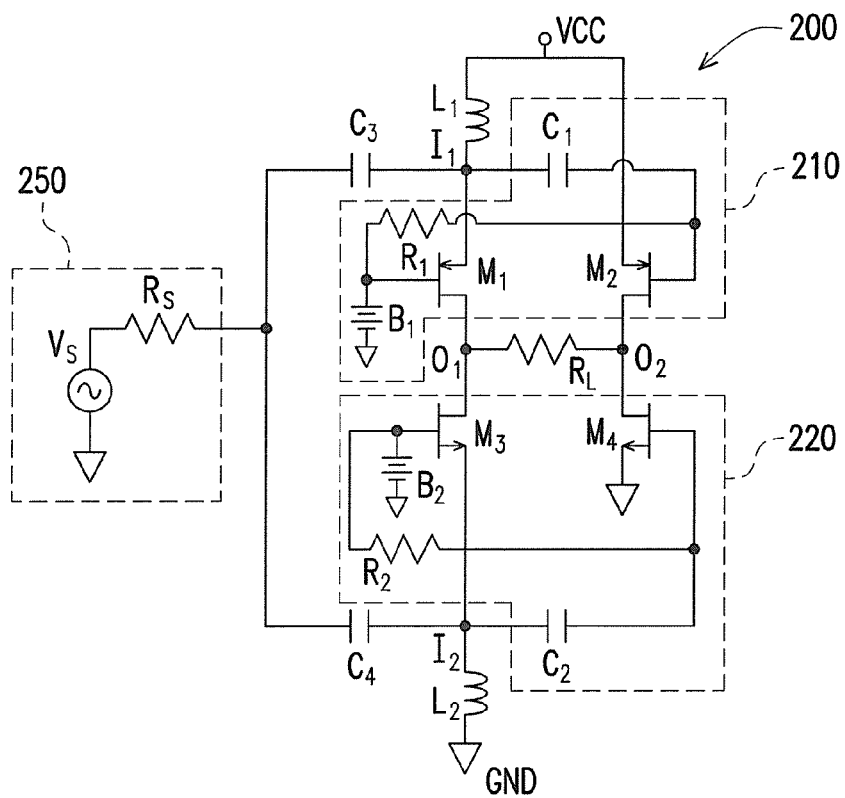
FIG. 2 is a circuit diagram illustrating a balun amplifier according to an embodiment of the present invention.

FIG. 2 is a circuit diagram illustrating a balun amplifier 200 according to an embodiment of the present invention. The balun amplifier 200 includes input terminals $I_1$ and $I_2$, output terminals $O_1$ and $O_2$, inductors $L_1$ and $L_2$, capacitors $C_3$ and $C_4$, and modules 210 and 220. The inductor $L_1$ is coupled between the input terminal $I_1$ and a power terminal VCC. The inductor $L_2$ is coupled between the input terminal $I_2$ and a ground terminal GND. The capacitor $C_3$ is coupled between the input terminal $I_1$ and an antenna circuit 250. The capacitor $C_4$ is coupled between the input terminal $I_2$ and the antenna circuit 250. The module 210 is coupled to the input terminal $I_1$ and the output terminals $O_1$ and $O_2$. The module 220 is coupled to the input terminal $I_2$ and the output terminals $O_1$ and $O_2$.

In the antenna circuit 250, $V_S$ represents a single-ended input signal received from the antenna, and $R_S$ represents the equivalent impedance of the antenna circuit 250. The capacitors $C_3$ and $C_4$ respectively couple the single-ended input signal $V_S$ to the input terminals $I_1$ and $I_2$. The balun amplifier 200 receives the single-ended input signal $V_S$ respectively through the input terminals $I_1$ and $I_2$, amplifies the single-ended input signal $V_S$, and converts the single-ended input signal $V_S$ into a differential output signal to output through the output terminals $O_1$ and $O_2$. The resistor $R_L$ represents the load impedance of the balun amplifier 200.

The inductors $L_1$ and $L_2$ respectively function as chokes, which are used to allow the direct current (DC) to pass and block the high frequency signals, i.e., the inductors $L_1$ and $L_2$ have great impedances for the high frequency signals. The inductors $L_1$ and $L_2$ can also be replaced by resistors with high impedances (far greater than $R_S$).

The module 210 includes p-channel metal oxide semiconductor field effect transistors (which is referred to as PMOS transistor hereinafter) $M_1$ and $M_2$, a capacitor $C_1$, a resistor $R_1$ and a bias circuit $B_1$. The PMOS transistor $M_1$ is coupled between the input terminal $I_1$ and the output terminal $O_1$, and the PMOS transistor $M_2$ is coupled between the input terminal $I_1$ and the output terminal $O_2$. The capacitor $C_1$ is coupled between the input terminal $I_1$ and the gate of the PMOS transistor $M_2$. The resistor $R_1$ is coupled to the gate of the PMOS transistor $M_2$. The bias circuit $B_1$ is coupled to the resistor $R_1$ and the gate of the PMOS transistor $M_1$.

The PMOS transistor $M_1$ forms a common gate amplifier, which receives the single-ended input signal $V_S$ from the input terminal $I_1$ and outputs the amplified single-ended input signal $V_S$ through the output terminal $O_1$. The PMOS transistor $M_2$ forms a common source amplifier, which receives the single-ended input signal $V_S$ from the input terminal $I_1$ through the capacitor $C_1$ and outputs the amplified single-ended input signal $V_S$ through the output terminal $O_2$. Output polarities of the common gate amplifier and the common source amplifier are out of phase to each other, i.e., the single-ended input signal $V_S$ is converted into the differential output signal that is output through the output terminals $O_1$ and $O_2$. The bias circuit $B_1$ provides biases required for operations of the common gate amplifier and the common source amplifier. There is no current passes through the resistor $R_1$, and the function of $R_1$ is to equate the bias voltages of the gates of the PMOS transistors $M_1$ and $M_2$.

The module 220 includes NMOS transistor $M_3$ and $M_4$, a capacitor $C_2$, a resistor $R_2$ and a bias circuit $B_2$. Circuit topologies of the first module 210 and the second module 220 are symmetric to each other except that types of the transistors therein are different. The NMOS transistor $M_3$ and $M_4$, the capacitor $C_2$, the resistor $R_2$ and the bias circuit $B_2$ in the module 220 one-to-one correspond to the PMOS transistor $M_1$ and $M_2$, the capacitor $C_1$, the resistor $R_1$ and the bias circuit $B_1$ in the module 210. The components in the modules 210 and 220 have the same coupling relations and functions, except that the input terminal $I_1$ is changed to the input terminal $I_2$. Therefore, details of the module 220 are not repeated.

For impedance matching, a parallel equivalent impedance of transconductances of small-signal models of the PMOS transistor $M_1$ and the NMOS transistor $M_3$ can be designed to be close to the equivalent impedance $R_S$ of the antenna circuit 250. In the present embodiment, $1/g_{m1}$ and $1/g_{m3}$ are respectively twice of the $R_S$ for impedance matching, wherein $g_{m1}$ and $g_{m3}$ are respectively transconductances of the PMOS transistor $M_1$ and the NMOS transistor $M_3$.

Figure 3:
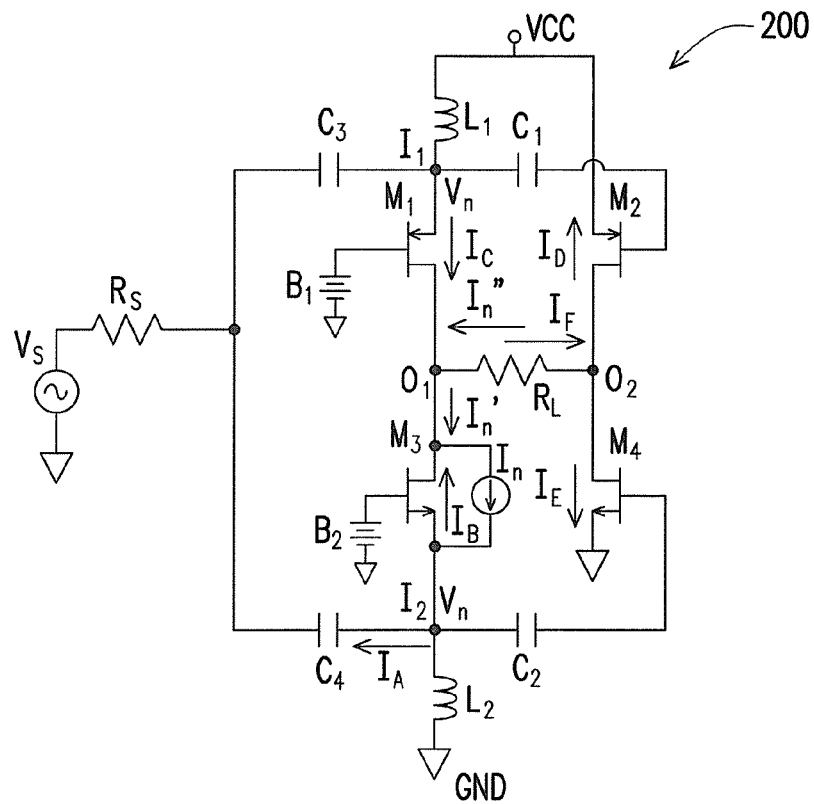
FIG. 3 and FIG. 4 are schematic diagrams respectively illustrating the process that the balun amplifier of FIG. 2 suppresses the effect of channel noises.
Figure 4:
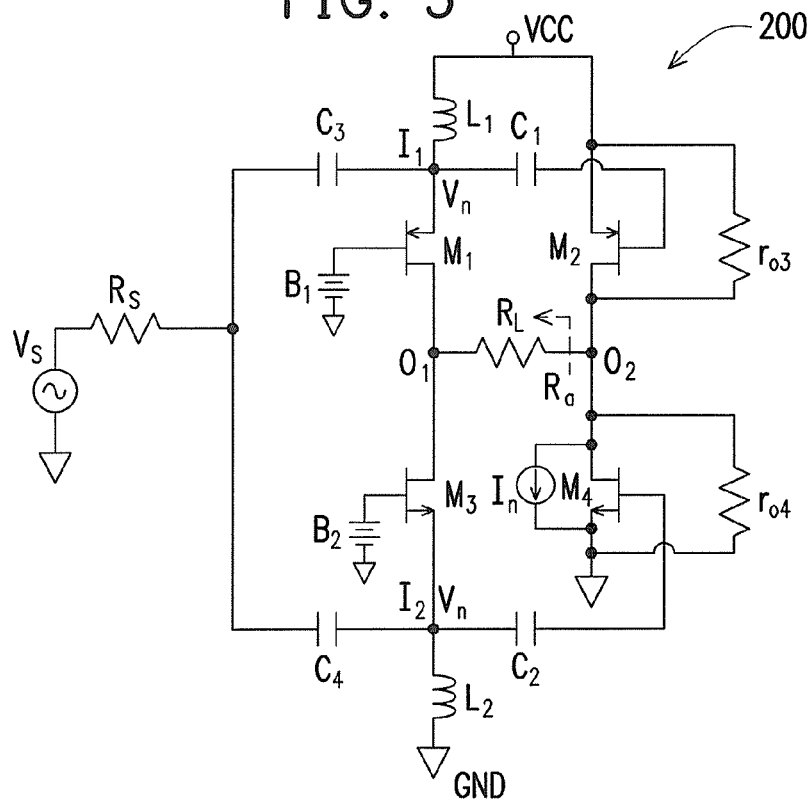

How the balun amplifier 200 suppresses the effect of channel noises of the transistors $M_1$-$M_4$ is described below. FIG. 3 is a schematic diagram illustrating a process that the balun amplifier 200 suppresses the effect of the channel noise of the transistor $M_3$. FIG. 4 is a schematic diagram illustrating a process that the balun amplifier 200 suppresses the effect of the channel noise of the transistor $M_4$. For simplicity's sake, the resistors $R_1$ and $R_2$ are omitted in FIG. 3 and FIG. 4.

In FIG. 3, the current source $I_n$ represents the channel noise current of the NMOS transistor $M_3$. The channel noise current $I_n$ is divided into noise currents $I_A$ and $I_B$. The noise current $I_B$ flowing towards the transistor $M_3$ itself counteracts a part of the channel noise current $I_n$ at the drain of the transistor $M_3$, so the noise current is less than the channel noise current $I_n$. The current $I_C$ also counteracts a part of the noise current $I_n$' at the output terminal $O_1$, so the noise current $I_n$" flowing out of the load impedance $R_L$ toward output terminal $O_1$ is less than the noise current $I_n$'. The noise voltage $V_n$ generated at the input terminals $I_1$ and $I_2$ due to the channel noise current $I_n$ of the transistor $M_3$ also causes currents $I_D$ and $I_E$ to flow through the transistors $M_2$ and $M_4$ respectively, which accordingly superpose to generate a current $I_F$ flowing out of the load impedance $R_L$ toward output terminal $O_2$. The current $I_F$ counteracts most of the noise current $I_n$" and the output noise voltage between the output terminals $O_1$ and $O_2$ is therefore nearly eliminated. The above description is the mechanism that the balun amplifier 200 efficiently cancels the effect of the channel noise of the NMOS transistor $M_3$. The effect caused by the channel noise of the PMOS transistor $M_1$ is also efficiently cancelled according to the same mechanism.

In FIG. 4, the current source $I_n$ represents the channel noise current of the NMOS transistor $M_4$, and $r_{o3}$ and $r_{o4}$ respectively represent the output impedances of the transistors $M_2$ and $M_4$. If the coupling paths through the capacitors $C_1$ and $C_2$ did not exist, the equivalent resistance $R_a$ looking into the load impedance $R_L$ from the left side of $O_2$ would be very large due to the series feedback resistor $R_S$ coupled to the sources of the PMOS transistors $M_1$ and $M_2$, and the noise current flowing through the load impedance $R_L$ would be very small. Although the coupling paths through the capacitors $C_1$ and $C_2$ slightly decrease the equivalent resistance $R_a$, the decreased equivalent resistance $R_a$ is still far greater than the output impedances $r_{o3}$ and $r_{o4}$. The shunt resistors $r_{o3}$ and $r_{o4}$ share most of the channel noise current $I_n$ of the transistor $M_4$ and only a tiny part of the noise current $I_n$ is left to flow through the load impedance $R_L$ to generate a tiny noise voltage between the output terminals $O_1$ and $O_2$. The above description is the mechanism that the balun amplifier 200 suppresses the effect of the channel noise of the NMOS transistor $M_4$. The effect caused by the channel noise of the PMOS transistor $M_2$ is suppressed according to the same mechanism.

Though the transistors $M_1$-$M_4$ all generate channel noises, the circuit design of the balun amplifier 200 can eliminate most of the output noise voltage caused by these channel noises and thus exhibits quite low noise figure.

Figure 5:
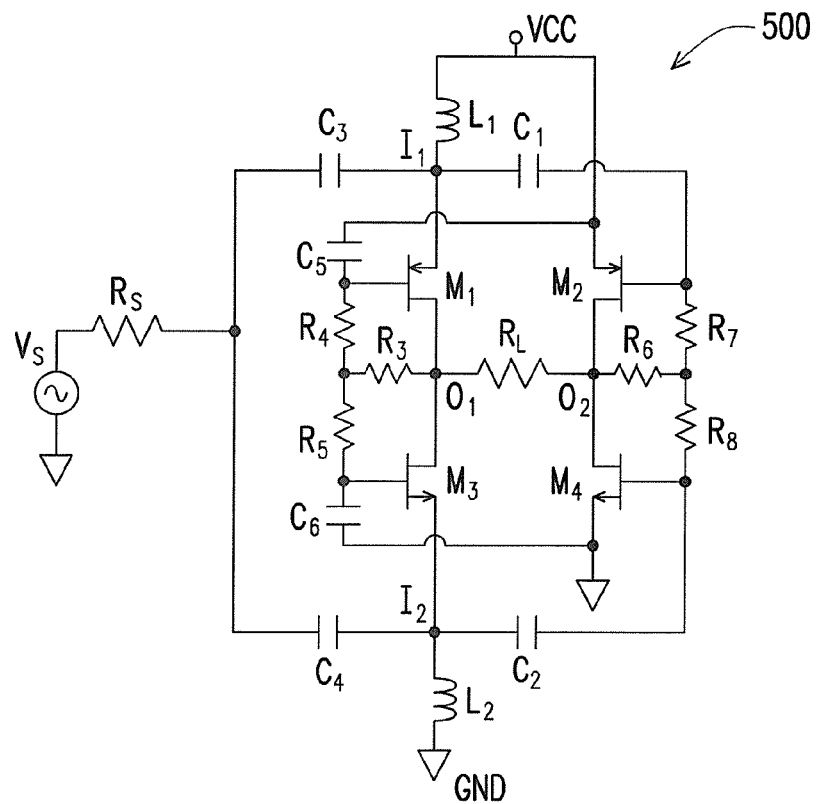
FIG. 5 is a circuit diagram illustrating a balun amplifier according to another embodiment of the present invention.

FIG. 5 is a circuit diagram illustrating a balun amplifier 500 according to another embodiment of the present invention. The difference between the balun amplifier 500 and the balun amplifier 200 of FIG. 2 is that a bias circuit is formed by capacitors $C_5$ and $C_6$ and resistors $R_3$-$R_8$, so as to provide biases required for operations of the transistors $M_1$-$M_4$. Wherein, the resistor $R_3$ is coupled to the output terminal $O_1$, the resistor $R_4$ is coupled between the resistor $R_3$ and the gate of the PMOS transistor $M_1$, and the resistor $R_5$ is coupled between the resistor $R_3$ and the gate of the NMOS transistor $M_3$. The resistor $R_6$ is coupled to the output terminal $O_2$, the resistor $R_7$ is coupled between the resistor $R_6$ and the gate of the PMOS transistor $M_2$, and the resistor $R_8$ is coupled between the resistor $R_6$ and the gate of the NMOS transistor $M_4$. The capacitor $C_5$ is coupled between the gate of the PMOS transistor $M_1$ and the power terminal VCC. The capacitor $C_6$ is coupled between the gate of the NMOS transistor $M_3$ and the ground terminal GND.

The transistors $M_1$ and $M_3$ are connected into two serial diodes through the resistors $R_3$-$R_5$, and the transistors $M_2$ and $M_4$ are also connected into two serial diodes through the resistors $R_6$-$R_8$. The resistors $R_3$-$R_8$ have large resistances to avoid influencing the normal operations of the amplifiers formed by the transistors $M_1$-$M_4$. To satisfy the operation requirement of the common gate amplifier in terms of small-signal model, the capacitors $C_5$ and $C_6$ are used to connect the gates of the transistors $M_1$ and $M_3$ to the ground. Such a simple bias circuit can fix the DC voltages of the output terminals $O_1$ and $O_2$ so that the balun amplifier 500 does not require other common gate bias circuits.

Figure 6:
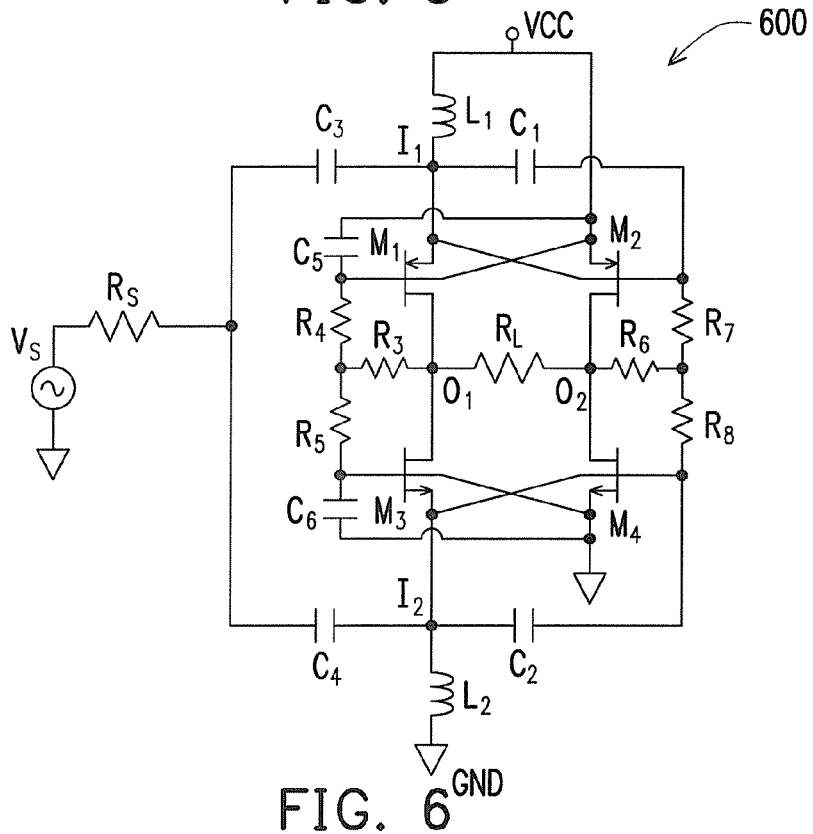
FIG. 6 is a circuit diagram illustrating a balun amplifier according to another embodiment of the present invention.

FIG. 6 is a circuit diagram illustrating a balun amplifier 600 according to another embodiment of the present invention. The difference between the balun amplifier 600 and the balun amplifier 500 of FIG. 5 is that the transistors $M_1$-$M_4$ are cross-coupled, i.e. the body of the transistor $M_1$ is coupled to the source of the transistor $M_2$, the body of the transistor $M_2$ is coupled to the source of the transistor $M_1$, the body of the transistor $M_3$ is coupled to the source of the transistor $M_4$, and the body of the transistor $M_4$ is coupled to the source of the transistor $M_3$. The above cross-coupling can increase the transconductances of the transistors $M_1$-$M_4$ in terms of the small-signal model, so as to cancel more noises.

The balun amplifier of the present invention has features of simple circuit topology, low noise, and impedance matching. Each of the transistors in this balun amplifier serves as an amplifier itself and plays a role in the noise cancellation for the balun amplifier as well. The balun amplifier can eliminate the noises according to its own circuit design and needs no redundant components that cause extra DC voltage drops. This property makes the balun amplifier quite suitable for the low-voltage operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A balun amplifier, comprising:
a first input terminal, receiving a single-ended input signal;
a second input terminal, receiving the single-ended input signal;
a first output terminal;
a second output terminal, the first output terminal and the second output terminal providing a differential output signal;
a first module, coupled to the first input terminal, the first output terminal, and the second output terminal; and
a second module, coupled to the second input terminal, the first output terminal, and the second output terminal,
wherein the first module and the second module respectively receive the single-ended input signal through the first input terminal and the second input terminal, respectively amplify the single-ended input signal, and convert the single-ended input signal into the differential output signal,
and circuit topologies of the first module and the second module are symmetric except that types of transistors in the first module and the second module are different.

2. The balun amplifier as claimed in claim 1, wherein the first module comprises:
a first common gate amplifier, formed by a first transistor, coupled between the first input terminal and the first output terminal, receiving the single-ended input signal from the first input terminal, and outputting the amplified single-ended input signal through the first output terminal;
a first common source amplifier, formed by a second transistor, coupled between the first input terminal and the second output terminal, receiving the single-ended input signal from the first input terminal, and outputting the amplified single-ended input signal through the second output terminal,
and the second module comprises:
a second common gate amplifier, formed by a third transistor, coupled between the second input terminal and the first output terminal, receiving the single-ended input signal from the second input terminal, and outputting the amplified single-ended input signal through the first output terminal; and
a second common source amplifier, formed by a fourth transistor, coupled between the second input terminal and the second output terminal, receiving the single-ended input signal from the second input terminal, and outputting the amplified single-ended input signal through the second output terminal.

3. The balun amplifier as claimed in claim 2, wherein the first transistor and the second transistor are PMOS transistors, and the third transistor and the fourth transistor are NMOS transistors.

4. The balun amplifier as claimed in claim 2, wherein the first module further comprises:
a first capacitor, coupled between the first input terminal and a gate of the second transistor, and the second module further comprises:
    a second capacitor, coupled between the second input terminal and a gate of the fourth transistor.
5. The balun amplifier as claimed in claim 2, wherein the first module further comprises:
    a first resistor, coupled to a gate of the second transistor; and
    a first bias circuit, coupled to the first resistor and a gate of the first transistor, and providing biases required for operations of the first common gate amplifier and the first common source amplifier,
and the second module further comprises:
    a second resistor, coupled to a gate of the fourth transistor; and
    a second bias circuit, coupled to the second resistor and a gate of the third transistor, and providing biases required for operations of the second common gate amplifier and the second common source amplifier.
6. The balun amplifier as claimed in claim 2, wherein the first transistor and the third transistor are connected into two serial diodes, and the second transistor and the fourth transistor are also connected into two serial diodes.
7. The balun amplifier as claimed in claim 6, further comprising:
    a third resistor, coupled to the first output terminal;
    a fourth resistor, coupled between the third resistor and a gate of the first transistor;
    a fifth resistor, coupled between the third resistor and a gate of the third transistor;
    a sixth resistor, coupled to the second output terminal;
    a seventh resistor, coupled between the sixth resistor and a gate of the second transistor; and
    an eighth resistor, coupled between the sixth resistor and a gate of the fourth transistor.
8. The balun amplifier as claimed in claim 2, wherein a body of the first transistor is coupled to a source of the second transistor, a body of the second transistor is coupled to a source of the first transistor, a body of the third transistor is coupled to a source of the fourth transistor, and a body of the fourth transistor is coupled to a source of the third transistor.
9. The balun amplifier as claimed in claim 1, further comprising:
    a third capacitor, coupled between the first input terminal and an antenna circuit; and
    a fourth capacitor, coupled between the second input terminal and the antenna circuit, wherein the antenna circuit provides the single-ended input signal.
10. The balun amplifier as claimed in claim 9, wherein a parallel equivalent impedance of transconductances of the first transistor and the third transistor is substantially equal to an impedance of the antenna circuit.
11. The balun amplifier as claimed in claim 1, further comprising:
    a first choke, coupled between the first input terminal and a power terminal to allow direct current (DC) signals to pass and block signals with frequencies higher than a predetermined threshold; and
    a second choke, coupled between the second input terminal and a ground terminal to allow the DC signals to pass and block signals with frequencies higher than the predetermined threshold.
12. The balun amplifier as claimed in claim 11, wherein the first choke comprises an inductor and the second choke comprises another inductor.
13. The balun amplifier as claimed in claim 11, wherein the first choke comprises a resistor and the second choke comprises another resistor.

14. A balun amplifier, comprising:
    a first input terminal, receiving a single-ended input signal;
    a second input terminal, receiving the single-ended input signal;
    a first output terminal;
    a second output terminal, the first output terminal and the second output terminal providing a differential output signal;
    a first transistor, coupled between the first input terminal and the first output terminal for receiving the single-ended input terminal from the first input terminal, and outputting the amplified single-ended input signal through the first output terminal;
    a second transistor, coupled between the first input terminal and the second output terminal for receiving the single-ended input terminal from the first input terminal, and outputting the amplified single-ended input signal through the second output terminal;
    a third transistor, coupled between the second input terminal and the first output terminal for receiving the single-ended input terminal from the second input terminal, and outputting the amplified single-ended input signal through the first output terminal; and
    a fourth transistor, coupled between the second input terminal and the second output terminal for receiving the single-ended input terminal from the second input terminal, and outputting the amplified single-ended input signal through the second output terminal.
15. The balun amplifier as claimed in claim 14, wherein the first transistor and the second transistor are PMOS transistors, and the third transistor and the fourth transistor are NMOS transistors.
16. The balun amplifier as claimed in claim 14, wherein the first transistor forms a first common gate amplifier, the second transistor forms a first common source amplifier, the third transistor forms a second common gate amplifier, and the fourth transistor forms a second common source amplifier.
17. The balun amplifier as claimed in claim 14, further comprising:
    a first capacitor, coupled between the first input terminal and a gate of the second transistor; and
    a second capacitor, coupled between the second input terminal and a gate of the fourth transistor.
18. The balun amplifier as claimed in claim 14, further comprising:
    a first resistor, coupled to a gate of the second transistor;
    a first bias circuit, coupled to the first resistor and a gate of the first transistor, and providing biases required for operations of the first transistor and the second transistor;
    a second resistor, coupled to a gate of the fourth transistor; and
    a second bias circuit, coupled to the second resistor and a gate of the third transistor, and providing biases required for operations of the third transistor and the fourth transistor.
19. The balun amplifier as claimed in claim 14, wherein the first transistor and the third transistor are connected into two serial diodes, and the second transistor and the fourth transistor are also connected into two serial diodes.
20. The balun amplifier as claimed in claim 19, further comprising:
    a third resistor, coupled to the first output terminal;
    a fourth resistor, coupled between the third resistor and a gate of the first transistor;
    a fifth resistor, coupled between the third resistor and a gate of the third transistor;

a sixth resistor, coupled to the second output terminal;
a seventh resistor, coupled between the sixth resistor and a gate of the second transistor; and
an eighth resistor, coupled between the sixth resistor and a gate of the fourth transistor.

21. The balun amplifier as claimed in claim 14, further comprising:
a third capacitor, coupled between the first input terminal and an antenna circuit; and
a fourth capacitor, coupled between the second input terminal and the antenna circuit, wherein the antenna circuit provides the single-ended input signal.

22. The balun amplifier as claimed in claim 21, wherein a parallel equivalent impedance of transconductances of the first transistor and the third transistor is substantially equal to an impedance of the antenna circuit.

\* \* \* \* \*